United States Patent
Chen et al.

(10) Patent No.: US 6,214,703 B1
(45) Date of Patent: Apr. 10, 2001

(54) METHOD TO INCREASE WAFER UTILITY BY IMPLEMENTING DEEP TRENCH IN SCRIBE LINE

(75) Inventors: Horng-Wen Chen, Taichung; Chen-Yu Chang, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/292,363

(22) Filed: Apr. 15, 1999

(51) Int. Cl.⁷ .......................... H01L 21/46; H01L 21/78; H01L 21/301
(52) U.S. Cl. .................. 438/462; 438/464; 438/734; 438/976
(58) Field of Search .................. 438/462, 464, 438/734, 976

(56) References Cited

U.S. PATENT DOCUMENTS

| 4,096,619 | 6/1978 | Cook, Jr. | 29/413 |
| 5,023,188 | 6/1991 | Tanaka | 437/8 |
| 5,614,445 | 3/1997 | Hirabayashi | 437/226 |
| 5,691,248 | 11/1997 | Cronin et al. | 437/227 |
| 5,693,181 | * 12/1997 | Bernstein | 156/644.1 |
| 6,075,280 | * 6/2000 | Yung et al. | 257/620 |

\* cited by examiner

Primary Examiner—John F. Niebling
Assistant Examiner—David A. Zarneke
(74) Attorney, Agent, or Firm—George O. Saile; Stephen B. Ackerman

(57) ABSTRACT

A method that teaches the formation of deep trenches within the surface of a semiconductor wafer, these deep trenches are used to separate the wafer into individual chips by applying stress to the wafer. The formation of the deep trenches uses exposing a thick layer of photoresist followed by etching. The etching is a two step etch, a stabilization etch and a main etch. The stress used to separate the wafer into individual chips can be invoked by applying physical force to the wafer.

13 Claims, 1 Drawing Sheet

METHOD TO INCREASE WAFER UTILITY BY IMPLEMENTING DEEP TRENCH IN SCRIBE LINE

BACKGROUND OF THE INVENTION (1) Field of the Invention

The invention relates to the field of semiconductor wafer manufacturing, and more specifically to a method to reduce the size of the scribe lines within the surface of a wafer.

(2) Description of Prior Art

Since the development of integrated circuit technology, semiconductor chips have been made from wafers of semiconductor material whereby each chip contains a plurality of integrated circuits. After the wafer is completed, the individual chip is typically separated from other chips by dicing the wafer into small chips. Thereafter, the individual chips are mounted on carriers of various types, interconnected by wires and further packaged.

The scribe line is used to scribe and break the semiconductor wafer into individual dies. In a typical semiconductor manufacturing process, a plurality of trenches are formed in the surface of each semiconductor wafer by scribing the surface of the semiconductor wafer. Scribing breaks the semiconductor wafer into a plurality of separate die. However, current practice asks for a die width of approximately 150 um. and requires a relatively large portion of the semiconductor surface to apply scribe lines. Current technology results in high losses, thereby reducing chip yield as a result of uneven scribing which causes cracks to form and which extend into the individual die.

The technique of laser scribing is an improvement in that no cracks are formed. However, due to non-uniformity in the planarization of the wafer surface and since the depth of focus of a wafer is difficult to control, unequal breaking of the wafer occurs also reducing the yield of wafers. Laser scribing further requires expensive equipment and adds considerably to the overall semiconductor chip manufacturing cost.

Prior Art has used a silicon etch to perform die separation. It has in the past however proven difficult to produce a photoresist that will stand up against the very strong acids that are used to etch silicon. Another technique uses diamond cutting to scribe the wafer surface. However, the diamond-cutting knife has a relatively large width, typically 50 um., while diamond cutting introduces problems of cutting tolerances. These tolerance problems require that a line width of a minimum of 75 um. is assigned to each line that must be scribed in the wafer surface. It is clear that this process requires the allocation of a relatively large area of the wafer surface that will be used up by the scribing operation.

One of the aspects of chip separation is the uniformity and lack of abrasion of the edges of the chip after the wafer has been separated into individual chips. This aspect becomes even more critical in a chip packaging environment where chips are stacked in multiple layers, the layers being separated by inter-level dielectrics. Increasing chip packaging density and the number of layers created to accomplish this density results in chips being in very close physical proximity to other parts of the complete chip package, most notably inter-level metal connects and metal interconnecting networks. This stacking of chips in increasing chip density results in problems caused by uneven separation of the chips from the wafer (the edge of the chip is not smooth and can therefore penetrate surrounding layers) or by affecting the thickness of layers that have been created in the chip. For instance thick layers of passivation where a heavy layer of polyimide is used as a passivation layer. Thin film processing is required to interconnect the chips after they have been separated from the wafer. Any of the defects mentioned have a negative impact on this thin film processing resulting in loss of chip yield. Improper chip separation from the wafer also limits the size of the stack that can be created using these chips. Current technology uses sawing or laser cutting to separate the chips, chip dicing defects can for these methods be controlled by controlling the speed by which the wafer is diced. This approach has however met with only limited success since, for most operations of this type, the dicing speed must be reduced resulting in reduced chip throughput while a time consuming post-dicing inspection must still be performed to verify chip edge characteristics.

Of further importance in dicing chips is the uniformity with which chips are diced since this uniformity affects the accuracy with which the chips can be mounted in a multi-stack chip configuration. Chip dicing operations must therefore result in chips of uniform dimensions, many of the chip mounting and packaging operations are performed using high speed and highly accurate machinery where tight tolerances and tolerance control is of extreme importance. Operations are performed on chips after they have been mounted in a multi-chip package such as the formation of interconnecting metal vias or the deposition of matching metal networks. These operations further highlight the need for consistent chip dicing operations under closed control of chip parameters. Any misalignment during the formation of the operations of chip interconnect results in expensive and time consuming rework whereby this rework can in many cases be performed only a limited number of times before the entire package must be scrapped.

In dicing chips, it is important that the dicing operation does not introduce variations in the thickness of the deposited surface layers within the chip. No foreign material of any kind can therefore be introduced (during the process of dicing) that remains on the chip after the chip has been diced. If dicing is performed using etchants, these etchants for the same reason can not exhibit chemical reactions with any of the surfaces with which the etchants come into contact. Such a chemical reaction can, for instance, affect the thickness of deposited passivation layers further taking away from the quality of the chip.

In a typical semiconductor manufacturing process, the substrate is, after the process of formation of the individual devices or components in the surface of the substrate has been completed, separated into its separate components. For this purpose, a plurality of trenches is formed in the surface of the substrate, these trenches can form separate transistor cells or capacitor cells or individual chips. Trenches that are created on the surface of the substrate take up valuable substrate surface area. It is therefore important to accomplish the separation of the individual components of a substrate in a manner such that the quality of this component is not affected while the surface area of the substrate that must be sacrificed to gain the individual components must be kept to a minimum. Dependent on the thickness of the wafer, the trenches that are created in the surface of the wafer may have to penetrate the wafer further. The trench is formed by etching, current processes frequently require added technology that validates the depth of the trench at the end of the etch process. This determines whether the substrate that has been etched is adequately etched and can therefore be separated in its individual components. A typical method of determining the end of the trench-formation process is the use of light reflecting apparatus of considerable complexity and therefore considerable expense. A method where the parameters of trench width and depth can be controlled or adequately predicted based on the processing parameters that are used for the formation of the trench is therefore to be preferred. The trench must have a desired and well-defined profile whereby it must be possible to create such a trench uniformly, consistently and at a reasonable cost. Trench depth is thereby important since the deeper the trench, the easier will be the step of actually separating the chips and other substrate components.

Reduction on scribe line width will result in the availability of a larger percentage of the wafer surface that can be dedicated to the creation of integrated circuits. The present invention addresses this aspect of semiconductor chip manufacturing.

U.S. Pat. No. 4,096,619 (Cook, Jr.) shows a process of etching trenches (by anodizing) in a scribe area and breaking the wafer by stress (not dicing). See abstract; see Cols. 2 and 3. This patent is close to the invention.

U.S. Pat. No. 5,614,445 (Hirabayashi) discloses a process where trench grooves are formed in the integrated circuit region of the wafer and dummy etched grooves are formed in a scribe line zone of the wafer. Both the trench grooves and the dummy etched grooves are filled with polycrystalline silicon to provide a smooth wafer surface. The wafer is then cleaved along the scribe line zone. Note that the patent generally claims "separating said semiconductor wafer into individual chips" and may not be limited to Dicing.

U.S. Pat. No. 5,023,188 (Tanaka) discloses a method to measure trench depths.

U.S. Pat. No. 5,691,248 (Cronin et al.) discloses a method to dice/separate wafers by forming trenches in the kerf.

SUMMARY OF THE INVENTION

A principle objective of the present invention is to increase wafer yield by decreasing the wafer surface area that is used for the process of dicing the wafer.

It is another objective of the present invention to decrease scribe-line width and thereby increase wafer yield.

It is another objective of the present invention to increase dicing accuracy and thereby increase wafer yield.

It is another objective of the present invention to simplify the wafer dicing process.

It is another objective of the present invention to eliminate yield loss due to equipment misalignment during the dicing process.

The present invention teaches the formation of deep trenches within the surface of a semiconductor wafer and the subsequent separation of the wafer into separate chips by applying stress to the wafer. The formation of the deep trenches uses exposing a thick layer of photoresist followed by etching. The etching is a two step etch, a stabilization etch and a main etch. The stress used to separate the wafer into individual chips can be invoked by applying physical force to the wafer.

DESCRIPTION OF THE PREFERRED INVENTION

Figure 1:
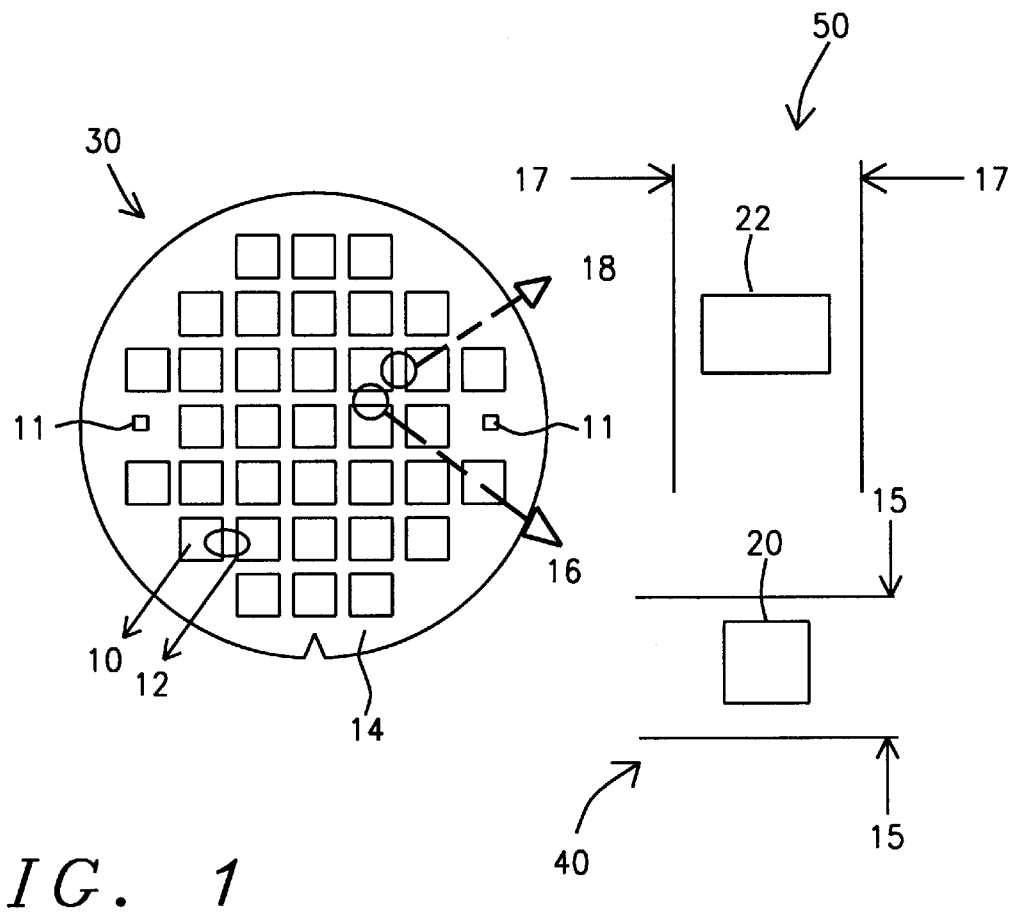
FIG. 1 shows a top view of a wafer including detailed top views of scribed lines using Prior Art techniques and the technique of the present invention.

Referring now specifically to FIG. 1, there is shown a top view 30 of the wafer 14 before the wafer is broken apart into individual chips 10, the scribe lines across the surface of the wafer are exemplified by highlighting one section 12 of a scribe line. Views 16 and 18 show enlargements of a scribe line in the X-direction (view 16) and of a scribe line in the Y direction (view 18). The wafer alignment markers 11 are also highlighted.

Section 40 (FIG. 1) shows an enlarged top view of the scribe line in the X-direction; section 50 (FIG. 1) shows and enlarged top view of the scribe line in the Y-direction. A typical Prior Art width 15 for the scribe line 16 in the X-direction is 150 um. A typical Prior Art width 17 for the scribe line 18 in the Y-direction is 100 um. Test keys or markers 20 and 22 are indicated within the boundaries of lines 16 and 18 respectively. These test markers 20 and 22 are used to align the pattern for the scribe lines by centering the markers within each of the lines. For instance, test marker 22 is used to align the scribe pattern in the X direction by centering this marker inside the scribe line 17. The marker 22 is placed (centered) at equal distance from the sides of scribe line 17. The same applies to test marker 20, which is used to align the scribe pattern in the Y direction; marker 20 is placed (centered) at equal distance from the sides of scribe line 15.

Figures 2, 3:
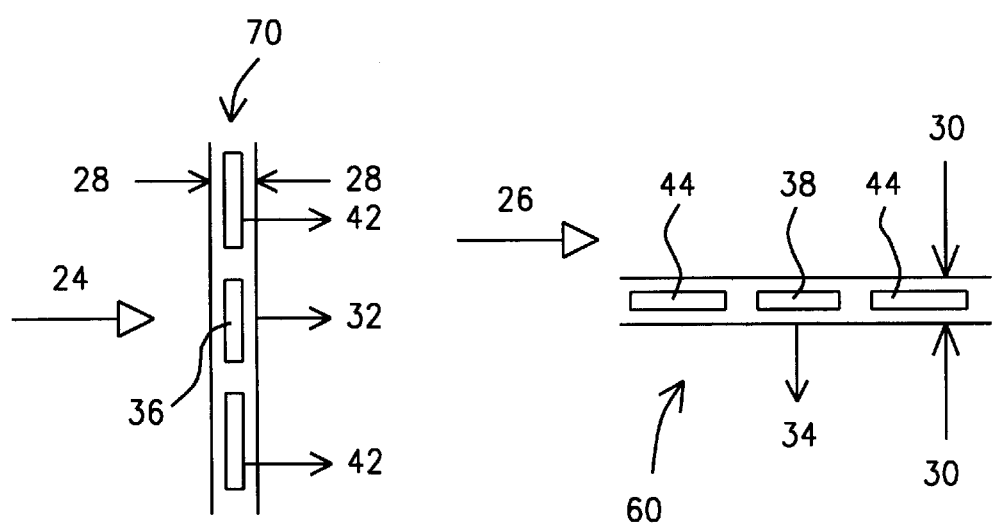
FIG. 2 shows a top view of a scribe line of the invention in the y-direction.
FIG. 3 shows a top view of a scribe line of the invention in the x-direction.

To be compared (arrow 24) in FIG. 2 are the widths of the scribe lines in the Y direction as shown in section 50 with the scribe line as shown in section 70. It is clear the width 28 (section 70) that is the width of the scribe line under the invention, is considerably smaller than the width 17 (section 50), that is the width of the Prior Art scribe line. The same comments apply to the scribe lines shown for the X direction (arrow 26): width 30 (section 60), that is the width of the scribe line under the invention, is considerably smaller than width 15 (section 40), that is the width of the Prior Art scribe line.

Sections 60 and 70 in FIG. 1 shows the reduction in line width gained by the application of the present invention. A typical width 30 within the scope of the present invention for the scribed line 34 in the X-direction is 10 um. A typical width 28 within the scope of the present invention for the scribe line 32 in the Y-direction is 10 um. Test key 38 is indicated within the boundaries of line 34, test key 36 is indicated within the boundaries of line 32. A deep trench 42 in scribe line 32 as created within the scope of the present invention is indicated in addition to a deep trench 44 in scribe line 34 as created within the scope of the present invention.

The processing flow required to create the narrower and deeper scribe lines starts with the deposition of a protective layer of photoresist over the surface of the wafer that is to be scribed, this protective layer is a heavy coating of photoresist to a thickness of about 5 um. This layer of photoresist is patterned for the scribe lines; the photoresist patterning uses the pattern of the alignment markers for its alignment, that is test key (alignment marker) 36 for alignment of the scribing pattern in the X direction and test key (alignment marker) 38 for alignment of the scribing pattern in the Y direction. After the scribe lines have been patterned on the photoresist, the photoresist is etched to form deep trenches in the photoresist. The photoresist and scribe lines are etched in a two step etch sequence, the first step is a stabilization etch (required for the thick layer of photoresist), the second step is the main etch which patterns the scribe lines. These two steps are followed by a dry etching step to remove the photoresist.

The stabilization etch is performed under conditions of between 700 and 800 milli Torr chamber pressure, 0 Watt RF power applied, with an etchant gas mixture of between 70 and 90 SCCM of $CF_4$ together with between 11 and 15 SCCM of $O_2$ together with between 5 and 7 Torr of B—He said first etch being applied for a time between 25 and 35 seconds.

The main etch that follows the stabilization etch is performed under conditions of between 700 and 800 milli Torr chamber pressure, between 240 and 310 Watt RF power applied, with an etchant gas mixture of between 70 and 90 SCCM of $CF_4$ together with between 11 and 15 SCCM of $O_2$ together with between 5 and 7 Torr of B—He said second step being applied for a time between 1000 and 1400 seconds.

The above cycle of photoresist coating, patterning, exposing for the formation of the pattern in the photoresist and the creation of the scribe lines and dry ashing for the removal of the photoresist can be considered on complete cycle. The thick layer of photoresist enabled the formation of scribe lines that are both narrow and that penetrate deeply into the surface of the wafer that is being scribed. The scribe line can in this manner be narrowed to 10 um. which leaves the line wide enough for a plasma etch to be applied in order to create the deep trench. With the above indicated process flow (of stabilization etch and main etch), it is possible to form trenches that are in excess of 7 um. deep.

It is believed that trenches as deep as 5 um. are adequate to scribe and cut wafers that are 300 (12 mil) thick. The above indicated cycle can be repeated a number of times for wafers that are thicker thereby making the process of the invention applicable for the scribing and breaking of future generations of thicker wafers. For the immediate future, it is not anticipated that trenches deeper than between about 5 and 100 um are required to be scribed to cut wafers, this objective can be met under the invention in one cycle (of photoresist deposition and patterning with stabilization/main etch as indicated above). Where deeper trenches are required this can be accomplished under the invention with a thicker layer of photoresist and repetition of the indicated etching cycle (once or more often) while, during these processes, tools of exposure (for the scribe pattern) of high selectivity (narrow line width) are being used. It is therefore clear that the principle of the invention can be extended to future generations of wafers by repetitively applying the above indicated cycle of stabilization etch and main etch in combination with thick layer of photoresist and tools of high selectivity for exposing and patterning of scribe lines.

Experiments have shown that scribe line width can be reduced by a factor in excess of fifteen, from 150 um. to less than 10 um. The invention further eliminates the previously experienced problems of misalignments during diamond cutting of the wafer. The method of exposing the photoresist pattern and etching this pattern to form deep trenches for the scribe lines is inherently more accurate than the (mechanical) process of diamond cutting of the wafer. The narrower scribe lines further allow increased use of the surface of the wafer thereby increasing chip yield and reducing overall chip cost.

The present invention as described herein is not intended to be limited to the details as presented. Rather, various modifications may be made in the details within the scope and range of equivalents of the claims and without departing from the spirit of the invention.

What is claimed is:

1. A method of making a plurality of individual integrated circuit chips from a semiconductor wafer, said wafer having a major surface, said method comprising the steps of:
   depositing a protective layer on the surface of said wafer;
   exposing pre-selected portions of said protective layer forming windows which expose said wafer in the regions to be scribed, wherein said exposing creates a pattern of scribe lines over the surface of said wafer, said scribe lines having line width in the x and the y direction of between 7.5 and 12.5 um, whereby said pre-selected portions are aligned with an alignment mark pattern;
   etching said exposed pre-selected portions of the surface of said wafer;
   removing said protective layer; and
   stressing said wafer until said wafer breaks along said pre-selected areas.

2. The method of claim 1 wherein said depositing a protective layer is depositing a photo resist coating to a thickness of between 3.5 and 7.9 um. on the surface of said semiconductor wafer.

3. The method of claim 1 wherein said etching is applying a two step etching process whereby the first etch is a stabilization etch and the second etch is the main etch.

4. The method of claim 3 wherein said first etch is an etch that stabilizes the etching environment in preparation for the main etch that is to follow said first etch having etching parameters of between 700 and 800 milli Torr chamber pressure, 0 Watt RF power applied, with an etchant gas mixture of between 70 and 90 SCCM of $CF_4$ together with between 11 and 15 SCCM of $O_2$ together with between 5 and 7 Torr of B—He said first etch being applied for a time between 25 and 35 seconds.

5. The method of claim 3 wherein said second etch is the main etch said main etch having etching parameters of between 700 and 800 milli Torr chamber pressure, between 240 and 310 Watt RF power applied, with an etchant gas mixture of between 70 and 90 SCCM of $CF_4$ together with between 11 and 15 SCCM of $O_2$ together with between 5 and 7 Torr of B—He said second step being applied for a time between 1000 and 1400 seconds.

6. The method of claim 5 whereby said main etch creates a scribe line pattern whereby the cross section of each scribe line has a width of between 7.5 and 12.5 um. and a depth of between 6.00 and 8.00 um.

7. The method of claim 1 wherein said removing said protective layer is a dry ashing process.

8. The method of claim 1 wherein said stressing said wafer is applying physical force to every corner of said window thereby separating said individual integrated circuits adjacent to said corners.

9. The method of claim 1 wherein said protective layer is formed by oxidation of the surface of said semiconductor wafer.

10. The method of claim 1 further in combination with repeating said method of making a plurality of individual integrated circuit chips said repetition containing the deposition of a protective layer of a thickness between 10 and 100 um. in combination with said first etch and said second etch process followed by the removal of said protective layer said repetition to be performed in sequence to the point where said trench exhibits a depth of between 5 and 100 um said method to be applied to wafers with a thickness in excess of approximately 200 um.

11. A method of making a plurality of individual integrated circuit chips from a semiconductor wafer, said wafer having a major surface, said method comprising the steps of:

depositing a protective layer on the surface of said wafer;
exposing pre-selected portions of said protective layer forming a pattern of scribe lines over the surface of said wafer said scribe lines having a line width in the X and the Y direction of between 7.5 and 12.5 um whereby said pre-selected portions are aligned with an alignment mark pattern;
etching said exposed pre-selected portions whereby said etching consists of a stabilization etch followed by a main etch said stabilization etch having etching parameters of between 700 and 800 milli Torr chamber pressure, 0 Watt RF power applied, with an etchant gas mixture of between 70 and 90 SCCM of $CF_4$ together with between 11 and 15 SCCM of $O_2$ together with between 5 and 7 Torr of B—He said first etch being applied for a time between 25 and 35 seconds whereby said main etch having etching parameters of between 700 and 800 milli Torr chamber pressure, between 240 and 310 Watt RF power applied, with an etchant gas mixture of between 70 and 90 SCCM of $CF_4$ together with between 11 and 15 SCCM of $O_2$ together with between 5 and 7 Torr of B—He said second etch being applied for a time between 1000 and 1400 seconds;
removing said protective layer; and
stressing said wafer until said wafer breaks along said pre-selected areas.

12. The method of claim 11 further in combination with repeating said method of making a plurality of individual integrated circuit chips said repetition containing the deposition of a protective layer of a thickness between 10 and 100 um. in combination with said stabilization etch followed by said main etch followed by the removal of said protective layer said repetition to be performed in sequence to the point where said trench exhibits a depth of between 5 and 100 um said method to be applied to wafers with a thickness in excess of approximately 200 um.

13. The method of claim 11 wherein said stressing said wafer is applying physical force to every corner of said window thereby separating said individual integrated circuits adjacent to said corners.

* * * * *